(12) United States Patent
Daeschner et al.

(10) Patent No.: US 10,895,669 B2
(45) Date of Patent: Jan. 19, 2021

(54) LIGHT EMITTING DEVICE WITH SELF-ALIGNING PREFORMED LENS

(71) Applicant: Lumileds LLC, San Jose, CA (US)

(72) Inventors: Walter Daeschner, San Jose, CA (US); Mikhail Fouksman, San Jose, CA (US); Mohiuddin Mala, San Jose, CA (US); Ashim Shatil Haque, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/572,074

(22) Filed: Sep. 16, 2019

(65) Prior Publication Data

US 2020/0116902 A1    Apr. 16, 2020

Related U.S. Application Data

(63) Continuation of application No. 15/110,840, filed as application No. PCT/IB2015/050050 on Jan. 4, 2015, now Pat. No. 10,416,356.

(Continued)

(51) Int. Cl.
*G02B 3/00* (2006.01)
*H01L 33/58* (2010.01)
(Continued)

(52) U.S. Cl.
CPC ............ *G02B 3/0075* (2013.01); *F21V 5/007* (2013.01); *F21V 17/101* (2013.01);
(Continued)

(58) Field of Classification Search
CPC ............. H01L 33/58; H01L 2933/0058; F21V 17/101; F21V 19/002; F21V 5/007; F21V 5/04; G02B 19/0061
See application file for complete search history.

(56) References Cited

U.S. PATENT DOCUMENTS 6,896,381 B2    5/2005    Benitez et al.
7,009,213 B2    3/2006    Camras et al.
(Continued)

FOREIGN PATENT DOCUMENTS

CN    101235953       8/2008
CN    102537720 A    7/2012
(Continued)

OTHER PUBLICATIONS

Article 94(3) EPC, dated Oct. 5, 2017, European Patent Application No. 15701247, 6 pages.
(Continued)

*Primary Examiner* — Peggy A Neils
(74) *Attorney, Agent, or Firm* — Schwegman Lundberg & Woessner, P.A.

(57) ABSTRACT

A light emitting diode (LED) light source is disclosed. The LED light source comprises a lens structure that includes a hemispherical dome with a base. The LED light source comprises a cavity in the base. The cavity has an opening and a taper such that a cross-section area within the cavity is smaller than an area of the opening. The LED light source comprises a light emitting device comprising an LED die contacting the taper. The taper allows for easy insertion of the LED die into the lens structure. The taper serves to accurately align the LED die when the LED die is inserted.

20 Claims, 3 Drawing Sheets

Related U.S. Application Data

(60) Provisional application No. 61/930,586, filed on Jan. 23, 2014.

(51) Int. Cl.
| | | |
|---|---|---|
| *F21V 5/00* | (2018.01) | |
| *F21V 17/10* | (2006.01) | |
| *F21V 19/00* | (2006.01) | |
| *G02B 19/00* | (2006.01) | |
| *H01L 25/075* | (2006.01) | |
| *H01L 33/60* | (2010.01) | |
| *H01L 33/62* | (2010.01) | |

(52) U.S. Cl.
CPC .......... *F21V 19/002* (2013.01); *G02B 3/0056* (2013.01); *G02B 19/0066* (2013.01); *H01L 25/0753* (2013.01); *H01L 33/58* (2013.01); *H01L 33/60* (2013.01); *H01L 33/62* (2013.01); *H01L 2933/0058* (2013.01)

(56) References Cited

U.S. PATENT DOCUMENTS

| | | | |
|---|---|---|---|
| 7,214,116 B2 | 5/2007 | Takekuma | |
| 7,452,737 B2 | 11/2008 | Basin et al. | |
| 7,465,961 B2 | 12/2008 | Masuda et al. | |
| 7,654,687 B2 | 2/2010 | Tsai et al. | |
| 7,858,408 B2 | 12/2010 | Mueller et al. | |
| 7,874,703 B2* | 1/2011 | Shastry .............. | G02B 19/0061 362/311.02 |
| 8,058,665 B2 | 11/2011 | Wang et al. | |
| 8,226,277 B2 | 7/2012 | Chen et al. | |
| 8,330,176 B2 | 12/2012 | Thompson et al. | |
| 8,461,616 B2 | 6/2013 | Zeiler et al. | |
| 8,597,988 B2 | 12/2013 | Shaikevitch et al. | |
| 8,801,221 B2 | 8/2014 | Lin et al. | |
| 8,803,171 B2 | 8/2014 | Bierhuizen et al. | |
| 8,835,958 B2 | 9/2014 | Hsieh | |
| 8,975,651 B2 | 3/2015 | Chou et al. | |
| 9,010,967 B2* | 4/2015 | Jensen ............... | G02B 19/0028 362/311.01 |
| 9,318,674 B2 | 4/2016 | Hussell et al. | |
| 9,688,035 B2 | 6/2017 | Swier et al. | |
| 10,297,731 B2* | 5/2019 | Odnoblyudov ......... | H01L 33/58 |
| 10,416,356 B2 | 9/2019 | Daeschner et al. | |
| 10,591,134 B2* | 3/2020 | Dong ...................... | G02B 3/00 |
| 2003/0168670 A1 | 9/2003 | Roberts et al. | |
| 2006/0078246 A1 | 4/2006 | Ashida | |
| 2008/0283861 A1* | 11/2008 | Loh ...................... | H01L 33/486 257/98 |
| 2009/0225566 A1 | 9/2009 | Zimmermann et al. | |
| 2011/0018016 A1 | 1/2011 | Bierhuizen et al. | |
| 2011/0110097 A1 | 5/2011 | Fu et al. | |
| 2012/0134152 A1 | 5/2012 | Ye et al. | |
| 2012/0299017 A1 | 11/2012 | Chen et al. | |
| 2012/0305971 A1 | 12/2012 | You et al. | |
| 2013/0039050 A1 | 2/2013 | Dau et al. | |
| 2013/0235581 A1 | 9/2013 | Iatan | |
| 2013/0322070 A1* | 12/2013 | Clark .................. | H01L 25/0753 362/235 |
| 2014/0377894 A1 | 12/2014 | Kwon et al. | |
| 2016/0341852 A1 | 11/2016 | Daeschner et al. | |

FOREIGN PATENT DOCUMENTS

| | | |
|---|---|---|
| CN | 103196040 A | 7/2013 |
| CN | 103196040 B | 3/2015 |
| CN | 105940262 A | 9/2016 |
| CN | 111063787 A | 4/2020 |
| EP | 2393135 | 12/2011 |
| JP | 6104491 | 4/1994 |
| JP | 11204841 | 7/1999 |
| JP | 2000-269555 | 9/2000 |
| JP | 2005-057266 A | 3/2005 |
| JP | 2005-101393 | 4/2005 |
| JP | 2007-059618 | 3/2007 |
| JP | 2011-113755 | 6/2011 |
| JP | 2011-137896 | 7/2011 |
| JP | 2011-138815 | 7/2011 |
| JP | 2011-521480 A | 7/2011 |
| JP | 2012-533904 A | 12/2012 |
| JP | 2017-504215 A | 2/2017 |
| KR | 20130113198 A | 9/2016 |
| WO | 2013/084155 | 6/2013 |
| WO | WO-2015/110927 A1 | 7/2015 |

OTHER PUBLICATIONS

EPO as ISA, International Search Report and Written Opinion dated Mar. 30, 2015 from International Application No. PCT/182015/050050, filed Jan. 4, 2015, 13 pages.
"U.S. Appl. No. 15/110,840, Advisory Action dated Jul. 6, 2018", 3 pgs.
"U.S. Appl. No. 15/110,840, Corrected Notice of Allowability dated Aug. 20, 2019", 2 pgs.
"U.S. Appl. No. 15/110,840, Corrected Notice of Allowability dated Oct. 24, 2018", 2 pgs.
"U.S. Appl. No. 15/110,840, Final Office Action dated Apr. 16, 2018", 15 pgs.
"U.S. Appl. No. 15/110,840, Non-Final Office Action dated Oct. 20, 2017", 13 pgs.
"U.S. Appl. No. 15/110,840, Notice of Allowance dated Sep. 25, 2018", 9 pgs.
"U.S. Appl. No. 15/110,840, Preliminary Amendment filed Jul. 11, 2016", 6 pgs.
"U.S. Appl. No. 15/110,840, Response filed Jan. 12, 2018 to Non-Final Office Action dated Oct. 20, 2017", 10 pgs.
"U.S. Appl. No. 15/110,840, Response filed Jun. 16, 2018 to Final Office Action dated Apr. 16, 2018", 12 pgs.
"U.S. Appl. No. 15/110,840, Response filed Aug. 16, 2018 to Advisory Action dated Jul. 6, 2018", 12 pgs.
"U.S. Appl. No. 15/110,840, Supplemental Notice of Allowability dated Dec. 3, 2018", 2 pgs.
"Chinese Application Serial No. 201580005512.X, Office Action dated May 29, 2019", (w/ English Translation), 13 pgs.
"Chinese Application Serial No. 201580005512.X, Office Action dated Nov. 1, 2018", (w/ English Translation), 12 pgs.
"English Translation of JP 2007-059618A, published Mar. 8, 2007", 10 pgs.
"European Application Serial No. 15701247.7, Communication dated Jan. 30, 2019", 15 pgs.
"European Application Serial No. 15701247.7, Response filed Jan. 22, 2018 to Communication Pursuant to Article 94(3) EPC dated Oct. 5, 2017", 35 pgs.
"European Application Serial No. 15701247.7, Response filed Apr. 30, 2019 to Communication dated Jan. 30, 2019", 9 pgs.
"International Application Serial No. PCT/IB2015/050050, International Preliminary Report on Patentability dated Aug. 4, 2016", 9 pgs.
"Japanese Application Serial No. 2016-547552, Amendment filed Dec. 26, 2017", (w/ English Translation), 5 pgs.
"Japanese Application Serial No. 2016-547552, Notice of Reasons for Rejection dated Jun. 11, 2019", (w/ English Translation), 10 pgs.
"Japanese Application Serial No. 2016-547552, Notice of Reasons for Rejection dated Nov. 6, 2018", (w/ English Translation), 10 pgs.
"Japanese Application Serial No. 2016-547552, Written Opinion and Amendment filed Jan. 31, 2019 in response to Notice of Reasons for Rejection dated Nov. 6, 2018", (w/ English Translation), 12 pgs.
"Japanese Application Serial No. 2016-547552, Written Opinion and Amendment filed Dec. 10, 2019 in response to Notice of Reasons for Rejection dated Jun. 11, 2019", (w/ English Translation), 10 pgs.
U.S. Appl. No. 15/110,840 U.S. Pat. No. 10,416,356, filed Jul. 11, 2016, Light Emitting Device With Self-Aligning Preformed Lens.

(56) References Cited

OTHER PUBLICATIONS

"Korean Application Serial No. 10-2016-7023018, Notice of Preliminary Rejection dated Feb. 19, 2020", (w/ English Translation), 10 pgs.
"Japanese Application Serial No. 2016-547552, Examiners Decision of Final Refusal dated Jun. 2, 2020", W/English Translation, 9 pgs.
"Korean Application Serial No. 10-2016-7023018, Response to filed Apr. 17, 2020 to Notice of Preliminary Rejection dated Feb. 19, 2020", w/ English Claims, 28 pgs.
"Korean Application Serial No. 10-2016-7023018, Notice of Preliminary Rejection dated Aug. 26, 2020", (w/ English Translation), 4 pgs.

\* cited by examiner

LIGHT EMITTING DEVICE WITH SELF-ALIGNING PREFORMED LENS

CROSS-REFERENCE TO RELATED APPLICATIONS

This application is a continuation of U.S. patent application Ser. No. 15/110,840 filed on Jul. 11, 2016, which is the U.S. National Stage, under 35 U.S.C. § 371 of International Application No. PCT/IB2015/050050, filed Jan. 4, 2015, which claim priority to U.S. Provisional Application No. 61/930,586 filed Jan. 23, 2014.

FIELD OF THE INVENTION

This invention relates to the field of light emitting devices, and in particular to a light emitting device that is formed by placing a self supporting light emitting element into a preformed lens having a cavity with sloped walls that facilitate insertion of the light emitting element into the lens and facilitate adhering the light emitting element to the lens.

BACKGROUND OF THE INVENTION

Conventional light emitting devices include a light emitting element, such as a light emitting diode chip (LED chip) mounted on a substrate and encased in a protective enclosure that may serve as an optical lens. The substrate provides the structural support required to facilitate handling of the light emitting device during subsequent processes, such as the mounting of the light emitting device on a printed circuit board. The protective enclosure may include a wavelength conversion material that converts at least a part of the light emitted from the light emitting chip to light of a different wavelength. The wavelength conversion material may alternatively be provided as a discrete element between the light emitting chip and the enclosure/lens.

Common techniques for providing a light emitting device as described above include attaching the light emitting element to a wire frame substrate that serves to allow external power connections to the light emitting element, then encapsulating the light emitting element and the portion of the wire frame to which it is attached with a silicone mold. The wire frame may be part of a carrier that includes multiple frames for mounting light emitting elements, such that the encapsulation can be performed for all of the light emitting elements as a single molding process.

In another embodiment, the light emitting element is mounted on a ceramic substrate that includes conductors to which the light emitting element is attached. U.S. Pat. No. 7,452,737, "MOLDED LENS OVER LED DIE", issued 18 Nov. 2008 to Grigoriy Basin, Robert Scott West, and Paul S. Martin, discloses a ceramic substrate that accommodates multiple light emitting elements, and a mold that forms a lens element over each of the light emitting elements. The ceramic substrate may subsequently be sliced/diced to provide 'singulated' light emitting devices that include external connections to the light emitting element on the ceramic substrate.

In another embodiment, the substrate includes cup-like cavities within which the light emitting elements are attached to conductors for coupling the light emitting element to a power source. The light emitting elements are encapsulated by filling the cavities with a low viscosity silicone and curing the silicone. The cavity may be shaped to provide a particular optical effect, and/or a mold may be used to form a desired lens structure above the cup. U.S. Pat. No. 7,214,116, "LIGHT-EMITTING DIODE AND METHOD FOR ITS PRODUCTION", issued 8 May 2007 to Akira Takekuma, discloses placing a preformed lens atop the silicone within the cup. After curing the silicone, the substrate is diced to provide the singulated light emitting devices.

Each of the above processes requires singulating the light emitting dies, mounting each die on the substrate, encapsulating the dies on the substrate, then slicing/dicing the substrate to singulate the completed light emitting devices. In addition to the additional manufacturing cost and effort associated with the double-handling involved with the intermediate step of mounting the light emitting dies on a substrate, this double-handling process also challenges applications wherein the light emitting die is required to have a particular location with respect to the optics of the enclosing structure. In many applications, if the light emitting element is 'off-center' relative to the optics of the enclosing structure, the formed light emitting device may be discarded as 'failed' in the manufacturing process, or may pass the manufacturing test and result in a defective product when it is incorporated into the product. For example, in a camera-flash application, if the camera/cell-phone/tablet/etc. produces pictures with non-uniform illumination, the purchaser of the camera/cell-phone/tablet/etc. will likely demand a replacement.

Although fairly simple techniques are available to properly align the substrate with the tool that provides the molded lens structure, such as creating alignment features in each of the substrate and the tool, achieving a correspondingly proper alignment of the light emitting element on the substrate is a more challenging and costly task, requiring, for example, a high-precision 'pick-and-place' machine to place each light emitting element at a highly-precise location on the substrate.

In order to avoid the aforementioned double-handling of the light emitting element, technologies have evolved to provide light emitting dies that are self-supporting, and can be handled directly. WO 2013/084155, "FORMING THICK METAL LAYERS ON A SEMICONDUCTOR LIGHT EMITTING DEVICE", published 13 Jun. 2013 for Schiaffion, Akram, Basin, Munkhol, Lei, and Nickel, and incorporated by reference herein, discloses light emitting elements that have thick metal layers that provide the structural support required for routine handling of the elements, eliminating the need for a supporting substrate. Because the self-supporting chip can be handled without further packaging, it is commonly termed a "Chip Scale Package" (CSP).

However, even though these self-supporting chips do not require a structural substrate, the conventional encapsulation processes still require that these chips be placed on some form of substrate, to allow multiple chips to be encapsulated at the same time, with the accompanying difficulty in assuring alignment of the light emitting chip and the attached lens structure.

SUMMARY OF THE INVENTION

It would be advantageous to provide a method and system that facilitates accurate alignment of light emitting chips and their associated lens structures. It would also be advantageous if this method and system are suitable for mass production processes.

To better address one or more of these concerns, in an embodiment of this invention, a lens structure is pre-formed with features that facilitate accurate alignment of a light emitting chip within the lens structure. To ease manufacturing, the features include tapered walls that allow for easy insertion of the light emitting chip into the lens structure, the taper serving to accurately align the light emitting chip when the chip is fully inserted. The taper may include linearly sloped or curved walls, including complex shapes. An adhesive may be used to secure the light emitting chip to the lens structure. The light emitting chips may be 'picked and placed' into an array of lens structures, or 'picked and placed' onto a substrate that may be overlayed by the array of lens structures.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
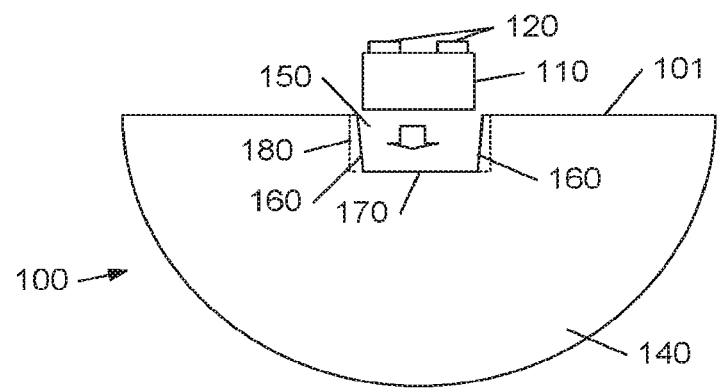
FIGS. 1A-1B illustrate an example profile and bottom view of a lens structure with sloped walls and channels that facilitate the exit of air bubbles and adhesives.
Figure 1B:
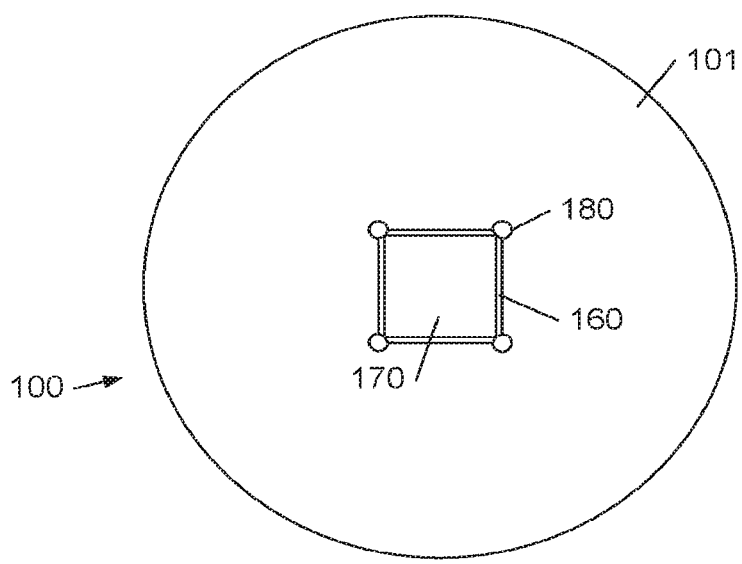

FIGS. 1A-1B illustrate an example profile and bottom view of a lens 100 that includes a cavity 150 for receiving a light emitting device (LED) 110, and an optical element 140 that provides a desired light output pattern when light is emitted from the LED 110. In this example, the optical element 140 is a hemispherical dome that provides a substantially uniform light output pattern across its field of view.

The lens 100 may comprise silicone, a silicone epoxy hybrid, glass, or any transparent optical material with an appropriate refractive index. The LED 110 may be a self-supporting device, such as a chip-scale-package (CSP), or a thin film die mounted on a ceramic substrate (die on ceramic, DOC), with contacts 120 on the surface opposite the light emitting surface 130. Other LED structures may also be used.

As illustrated, to ease assembly, the cavity 150 is tapered, and includes sloped walls 160. The bottom surface 170 of the cavity 150 is dimensioned so as to situate the light emitting device 110 at a fixed location within the cavity 150 within a given precision, based on the requirements of the intended application. In this example, the bottom surface 170 has substantially the same dimensions as the light emitting device, although it may be slightly larger, depending upon the tolerances of the light emitting device. The required precision of the location of the light emitting device 110 with respect to the lens structure 100 may dictate the allowable over-sizing, if any, of the bottom surface 170.

An adhesive having a refractive index that is equal to the refractive index of the LED 110 or the lens 100, or a value between the refractive indexes of the LED 110 and lens 100 may be dispensed into the cavity 150 before the LED 110 is inserted into the cavity. Depending upon the particular assembly technique, the adhesive may also, or alternatively, be dispensed upon the LED 110 prior to insertion into the cavity 150.

As illustrated in FIGS. 1A and 1B, channels 180 may be provided to enable air and excess adhesive to escape during the assembly process. These channels 180 are illustrated as cylindrical borings in FIGS. 1A and 1B, although other shapes may be used; for example, if the cavity is formed by a molding process, the channels may have the same slope as the sloped walls 160.

The channels 180 are illustrated at each corner of the cavity 150, although other locations, and fewer or more channels may be provided. In one alternative channels located at the sides of the LED 100 and away from the corners may be used to avoid rotational alignment errors. The size, shape, and location of the channels may be altered depending upon multiple factors including, for example, the viscosity of the adhesive, and the overall size of the LED 110.

In another embodiment, the LED 110 is inserted into the cavity without an adhesive between the light emitting surface 130 and the bottom surface 170 of the cavity 150. A thin film of index-matched liquid may be used to provide an efficient optical coupling between the LED 110 and the bottom surface 170. After insertion, an adhesive may be administered in the space between the LED 110 and the sloped walls 160. This post-insertion application of the adhesive may eliminate or minimize the need for the channels 180.

To ease subsequent mounting of the lens 100 with LED 110 on a subsequent substrate, such as a printed circuit board, the depth of the cavity 150 may be determined such that the contacts 120 extend slightly above ('proud of') the underside 101 of the lens 100 when the light emitting device is fully situated within the cavity. A depth that is about 50-500 um less than the total height of the LED 110, including contacts 120, generally provides a sufficient pride0 of the contacts beyond the underside 101 of the lens 100, although other depths may be used, depending upon the tolerance requirements of the application. For example, if the LED 110 is a self-supporting chip-scale package, with fine tolerances, a nominal proud as small as 5 um may be used.

By shaping the taper such that the opening of the cavity 150 is larger than the dimensions of the LED 110, insertion of the LED 110 into the cavity 150 is simplified. By shaping the taper such that the cross-section of the cavity 150 narrows in a direction toward the bottom surface 170, variance in the location of the LED 110 within the lens 100 is substantially controlled, providing for a self-alignment of the LED 110 as it is inserted into the lens 100. This taper also provides this self-alignment independent of the means used to insert the LED 110 into the cavity 150. Even a manual insertion of the LED 110 into the cavity 150 will provide the same accuracy and precision as an automated insertion using a highly accurate and precise pick-and-place machine. In like manner, a pick-and-place machine of minimal accuracy and precision may be used while still maintaining the same high level accuracy and precision.

Figure 2:
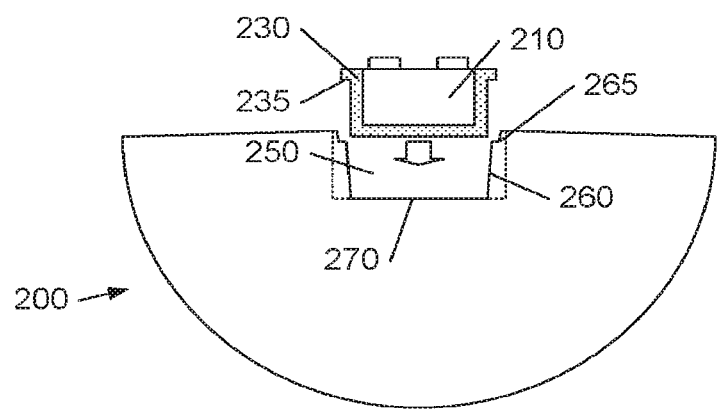
FIG. 2 illustrates an example profile view of a lens structure with stepped and sloped walls.

As illustrated in FIG. 2, the profile of the cavity 250 of lens 200 may be adjusted to conform to the shape of the light emitting device 210. In this example, the light emitting device 210 includes a wavelength conversion layer 230, such as a phosphor-embedded silicone that is molded upon the light emitting device 210. A recess 265 at the entry to the cavity 250 is shaped to accommodate the lip 235 formed by this example wavelength conversion layer 230.

Below the recess 265, the cavity 250 includes sloped walls 260 to facilitate insertion of the light emitting device 210, and a bottom surface 270 that serves to locate the light emitting device within the lens 200 within a given precision, as detailed above with regard to surface 170 of lens 100.

Figure 3A:
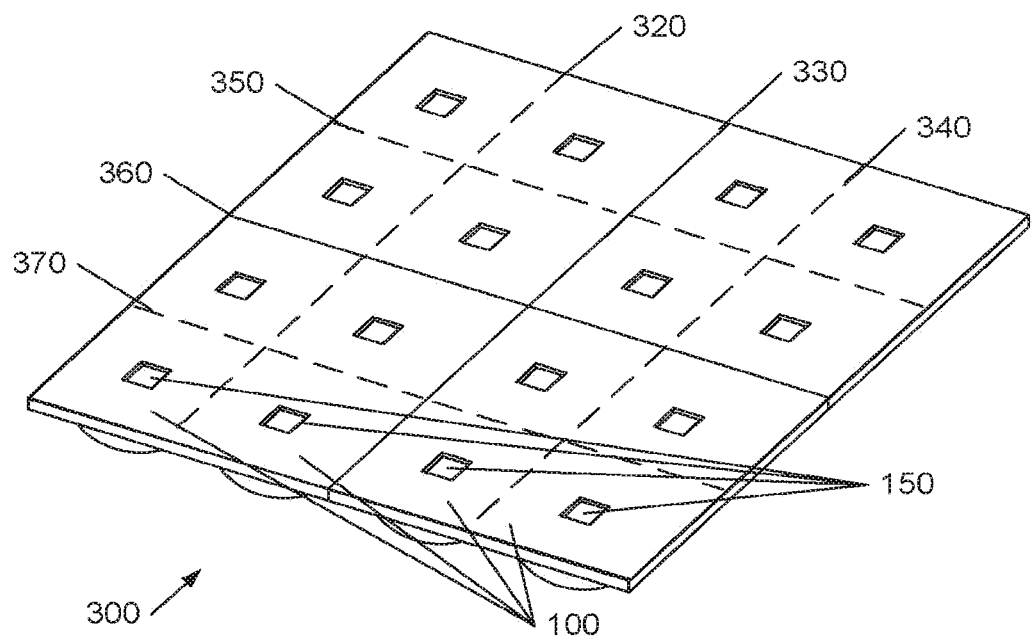
FIGS. 3A and 3B illustrate example sheets of lens structures with tapered cavities.
Figure 3B:
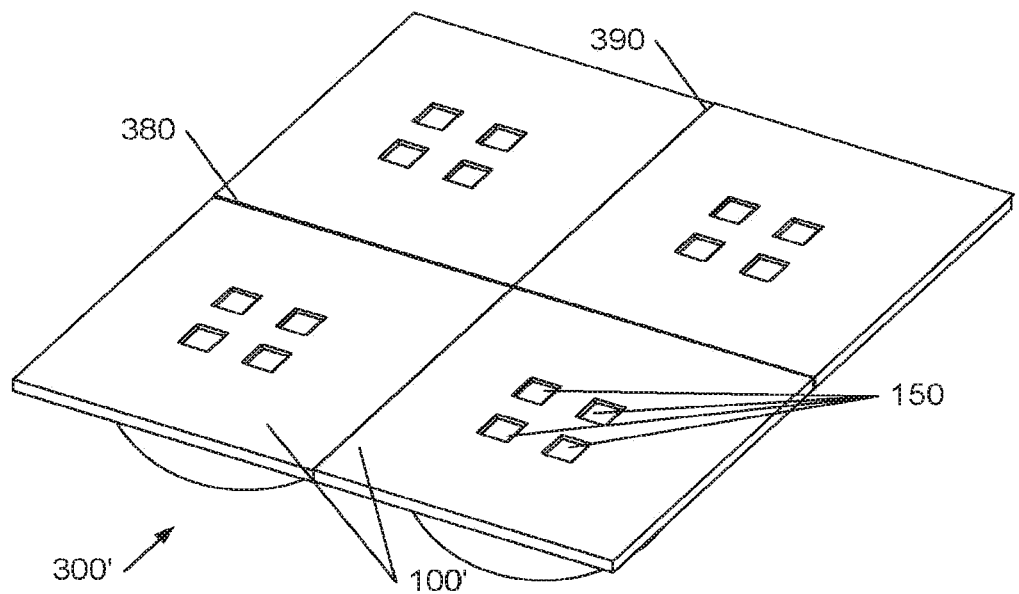

FIGS. 3A and 3B illustrate example sheets 300, 300' of lenses 100, 100' with cavities 150. Although only a few lenses 100, 100' are illustrated, one of skill in the art will recognize that the sheets 300, 300' may include hundreds of lenses 100, 100'. For ease of illustration, the venting channels 180 of each cavity 150 of FIGS. 1A-1B are not illustrated, but may be present.

In the example of FIG. 3A, sheet 300 includes sixteen lenses 100, each with a single cavity 150. This sheet may comprise, for example silicone, a silicone epoxy hybrid, glass, or any other transparent optical material that can be formed with defined cavities.

In an example manufacturing process, a pick and place machine may be used to insert each LED 110 (not illustrated) into each cavity 150. The pick and place machine may be configured to place each LED 110 at the center of each cavity 150, but with sufficient compliance during the insertion to enable the LED 110 to be guided by the walls of the cavity 150 into the desired location. Alternatively, the pick and place machine may place each LED 110 partially into each cavity 150, and a subsequent process, such as a plate press may be used to complete the insertion of the LEDs 110 into the cavities 150.

In an alternative process, the LEDs are arranged on a temporary substrate, such as a conventional "dicing tape", at appropriate locations, and the sheet 300 is mated with these LEDs on the substrate, by either overlaying the sheet 300 upon the LEDs, or overlaying the dicing tape with attached LEDs over the sheet 300.

In an example embodiment, the sheet 300 is a partially cured silicone that is cured after the LED 110 is inserted into each cavity 150. The subsequent curing may serve to adhere each LED 110 to each lens 100, thereby avoiding the need to include an adhesive bond.

In an alternative embodiment, the sheet 300 is fully formed, and an adhesive may be applied to each cavity 150, or to each LED 110, to secure each LED 110 to each lens 100. In some embodiments, the adhesive is applied after the LEDs 110 are inserted into the cavities 150, adhering the edges of the LEDs 110 to the walls of the cavities 150.

In other embodiments, detailed below, the sheet 300 may comprise a material with some resilience, and the insertion of the LED 110 into the cavity 150 may provide a sufficient friction force to maintain the LED 110 at the appropriate location within the lens 100.

A material that facilitates optical coupling between the light emitting surfaces of the LEDs 110 and the lenses 100 of the sheet 300 may be applied to either the cavities 150 or the LEDs 110.

In like manner, a material that serves to reflect light that strikes the edges of the LED 110 may be applied to the edges of the LED 110, for example, by filling the gap between the LED 110 and the sloped walls of the cavity 150 with such material.

Upon completion of the insertion and adhering of the LEDs 110 in the Cavities 150 of the lenses 100, the sheet 300 may be sliced/diced along the cutting lines 320-370 to provide singulated LED with lens assemblies. In some embodiments multiple LED with lenses may be provided as a single assembly, for example, by only slicing along lines 330 and 360, providing four assemblies, each assembling including four LEDs with individual lenses.

One of skill in the art will recognize that the example one-to-one relationship between LEDs and lenses of the previous figures is merely one of many configurations. For example, FIG. 3B illustrates an embodiment wherein multiple LEDs are intended to be inserted into multiple cavities 150 of each lens 100'. In such an embodiment, the cavities 150 of each lens 100' may be more closely situated than the cavities 150 of each lens 100 of FIG. 3A.

In some embodiments, one or more of the cavities 150 may be configured to accommodate multiple LED dies, which may be arranged on a single substrate. In other embodiments, the cavities 150 within each lens 100' may be of different sizes, to accommodate a mix of different LED types within the lens 100', such as a combination of different color LEDs.

As in the example of FIG. 3A, the LEDs 110 (not illustrated) may be inserted into each cavity manually, or via a pick-and-place process. Or, the LEDs 110 may be arranged on a temporary substrate at locations corresponding to cavities 150 on the sheet 300', and subsequently mating the sheet 300' and the substrate containing the LEDs 110. Similarly, the LEDs 110 may be adhered to the lenses 100' using any of the above described techniques, or any other viable and reliable technique.

Upon completion of the insertion and adhering of the LEDs 110 into the Cavities 150 of each lens 100', the lenses 100' may be singulated by slicing/dicing the sheet 300' along the cutting lines 380, 390.

One of skill in the art will recognize, in view of this disclosure, that this invention is not limited to the example use of cavities 150 with linearly sloped walls 160.

FIGS. 4A-4D illustrate alternative cavity profiles. As in FIGS. 3A-3B, the venting channels 180 of FIG. 1 are not illustrated in these figures, for ease of illustration, but may be included in each example embodiment.

Figure 4A:
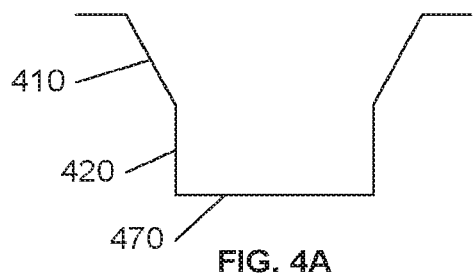
FIGS. 4A-4D illustrate example profiles of complex tapered cavities.

FIG. 4A illustrates a profile comprising wall segments 410, 420 having different slopes. The upper wall segment 410 has a relatively shallow slope to provide a wide opening for inserting the LED (not illustrated), while the wall segment 420 has a relatively steep slope, and may be orthogonal to the surface 470, to provide a larger surface area for constricting the edges of the LED to maintain the proper location of the LED within the cavity.

Figure 4B:
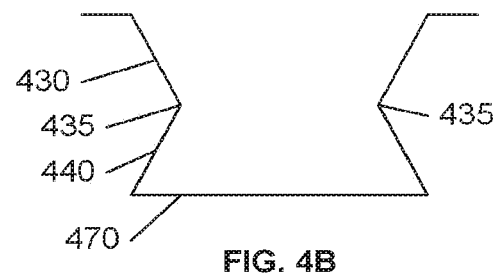
Figure 4C:
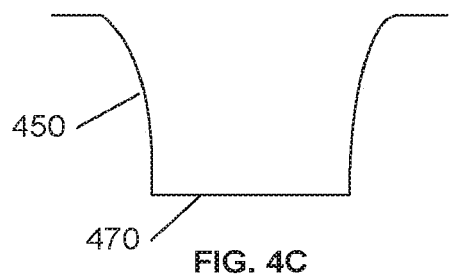
Figure 4D:
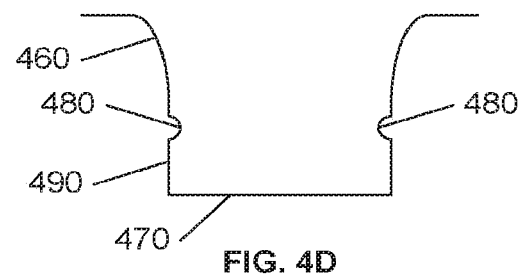

Depending upon the material in which the cavity is formed, the closeness of the fit between the size of the LED and the size of the surface 470, the slope of the lower wall segment 420, and the size of the venting channels 180 (not illustrated), this embodiment may require substantial force to insert each LED into each cavity. FIGS. 4B-4D illustrate alternative profiles that may require less insertion force.

In FIG. 4B, the upper wall segment 430 is sloped to provide an opening that is larger than the size of the intended LED, and the lower wall segment 420 is sloped in an opposite direction to create protrusions 435 that serve to constrict the edges of the LED to maintain the proper location of the LED within the cavity. However, as compared to FIG. 4A, the edges of the LED will only contact these protrusions 435, and not the entire surface of the lower wall segment 440. The reversed slope of the wall segment 440 provides a lower surface 470 that is wider than the LED that is containing between the protrusions 435, providing some room for the displaced air or adhesive, reducing or eliminating the reliance on the venting channels 180.

In FIG. 4C, a curved wall segment 450 is used to gradually reduce the cross section area in the direction of the surface 470 in a non-linear fashion, so that the lower portion of the wall segment 450 may be more constraining of the LED compared to the linearly sloped walls 160 of FIG. 1, but less constraining compared to the linear wall segment 420 of FIG. 4A, particularly if the segment 420 is orthogonal to the surface 470. The continuous curvature of the wall segment 450 may also ease the insertion of the LED, compared to the abrupt edges at the transition between wall segment 410 and 420 of FIG. 4A.

FIG. 4D illustrates a combination of curved 460 and linear 490 wall segments, as well as the addition of features 480 that may secure the LED while introducing minimal insertion resistance. The features 480 may be a continuous ridge within the cavity, or a plurality of individual bead-like protrusions from the wall segment 490. If individual protrusions are used, the insertion resistance is reduced, and the space between the protrusions allows for the displaced air and adhesive to escape, potentially avoiding the need for the venting channels 180 of FIG. 1.

One of skill in the art will recognize, in light of this disclosure, that any of a variety of other profiles may be used to fix the location of the LED within the lens within a given tolerance, while also allowing for practical insertion forces.

One of skill in the art may also recognize that the shape of the cavity, or the shape of the surface of the cavity, need not match the shape of the LED. Depending upon the processes and materials used to create the lens, creating a rectangular cavity, such as illustrated in FIG. 1B, may not be economically viable. If, for example, the lens is a rigid material, boring or grinding a circular cavity may be substantially less expensive than creating a rectangular cavity.

Figure 5:
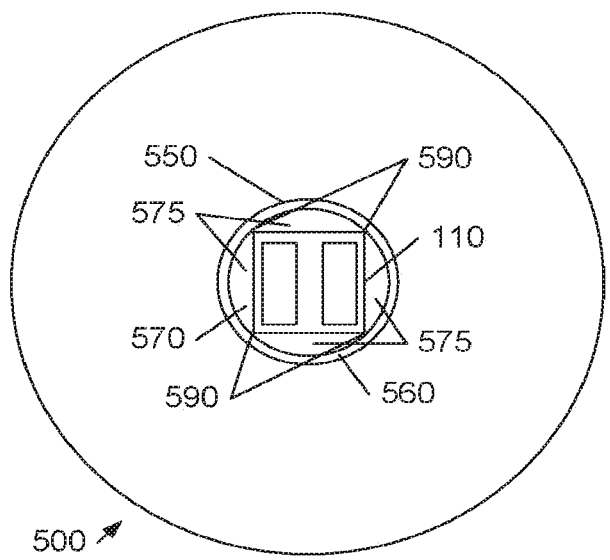
FIG. 5 illustrates an example bottom view of a lens structure with a conic-section cavity.

FIG. 5 illustrates an example lens 500 that includes a conical cavity 550 with a sloped wall 560 that forms a circular bottom surface 570. The diameter of the surface 570 is such that it circumscribes the LED 110, providing contact points 590 on the wall of the cavity that center the LED 110 at the center of the surface 570. The semicircular gaps 575 around LED 110 allows for the displaced air and adhesive to escape, potentially avoiding the need for the venting channels 180 of FIG. 1

As contrast to the rectangular surface 170 of FIG. 1B, the conic cavity 550 and circular surface 570 may allow the LED 110 to rotate during the insertion process, but if the optical properties of the lens 500 are symmetric about the center axis, the rotation of the LED 110 about this center axis will have no effect on the accuracy and precision of locating the LED 110 at that center axis. If the lens 500 is a partially cured silicone, the compliance of the partially cured silicone may enable the LED 100 to "dig in" to the silicone at the corners 590, thereby controlling or limiting the rotation.

It is significant to note that all of the above example profile views could also be profile views of half-sections of conic cavities, although the profiles of FIGS. 4B and 4D would more likely be formed by a molding process, rather than a boring or grinding process, and achieving a rectangular cavity via a molding process is relatively straightforward.

Figure 6A:
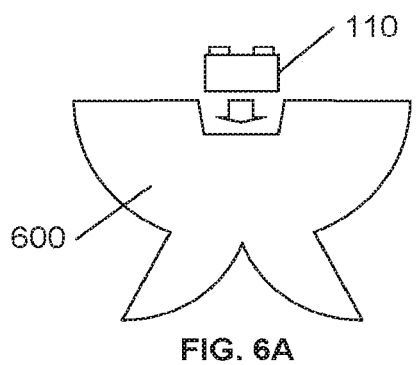
FIGS. 6A and 6B illustrate alternative optical elements.
Figure 6B:
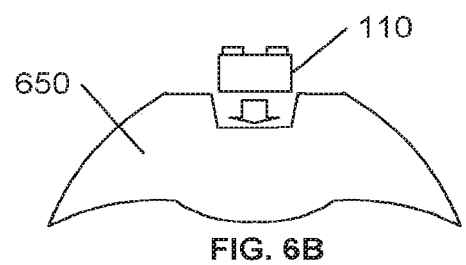

One of skill in the art will also recognize that the optical element of the lens is not limited to the hemispherical dome 140 of FIGS. 1A-1B. FIGS. 6A and 6B illustrate an example side emitting optical element 600, and an example collimating optical element 650, respectively. Other optical elements may be used to achieve desired light output patterns.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein additional elements may be included within the cavity. For example, a wavelength conversion material may be inserted into the cavity before the light emitting device is inserted. Alternatively, or additionally, the lens may include a wavelength conversion material, or the light emitting device may include a wavelength conversion material. In some embodiments, the wavelength conversion material may serve as an adhesive layer between the light emitting device and the lens.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

What is claimed is:

1. An illumination system, comprising:
    a lens having a first surface configured to receive light and substantially direct the light into the lens,
    the lens having a second surface, opposite the first surface, configured to substantially direct the light out of the lens,
    the first surface shaped to define a cavity that extends into the lens from a cavity opening to a cavity bottom,
    the cavity having an interior bounded by at least one cavity wall that extends between the cavity opening and the cavity bottom,
    the at least one cavity wall being tapered inward such that for at least one depth into the cavity, a cross-sectional area of the at least one cavity wall, taken substantially parallel to the cavity bottom, is less than a cross-sectional area of the cavity opening, taken substantially parallel to the cavity bottom,
    the at least one cavity wall including at least one venting channel that is configured to allow displacement of material in the cavity,
    the at least one cavity wall including a first portion that adjoins the cavity opening, the first portion being angled with respect to a surface normal of the cavity bottom,
    the at least one cavity wall including a second portion between the first portion and the cavity bottom, the second portion being substantially orthogonal to the cavity bottom.

2. The illumination system of claim 1, wherein the at least one venting channel includes at least one cylindrical boring.

3. The illumination system of claim 1, wherein the at least one cavity wall includes a plurality of cavity walls that each extend between the cavity opening and the cavity bottom.

4. The illumination system of claim 3, wherein the cavity bottom is smaller than the cavity opening.

5. The illumination system of claim 3 wherein the plurality of cavity walls includes four walls.

6. The illumination system of claim 5, wherein the cavity opening is a square.

7. The illumination system of claim 3, wherein the cavity opening extends in a first plane and the cavity bottom extends in a second plane.

8. The illumination system of claim 7, wherein the second plane is parallel to the first plane.

9. The illumination system of claim 7, wherein the first surface of the lens extends in the first plane.

10. The illumination system of claim 3, wherein the at least one venting channel includes multiple venting channels that are positioned along edges between adjacent cavity walls of the plurality of cavity walls.

11. The illumination system of claim 3, wherein:
each cavity wall includes a respective first portion that adjoins the cavity opening, the respective first portion being angled with respect to the surface normal of the cavity bottom; and
each cavity wall includes a respective second portion between the respective first portion and the cavity bottom, the respective second portion being substantially orthogonal to the cavity bottom.

12. The illumination system of claim 11, wherein the at least one venting channel includes multiple venting channels that are formed as cylindrical borings located between adjacent second portions of the cavity walls, each cylindrical boring being substantially orthogonal to the cavity bottom.

13. The illumination system of claim 3, wherein:
each cavity wall includes a respective first portion that adjoins the cavity opening, the respective first portion being angled with respect to the surface normal of the cavity bottom;
each cavity wall includes a second portion between the respective first portion and the cavity bottom, the second portion being angled with respect to the surface normal of the cavity bottom;
the second portion and the respective first portion, for each cavity wall, adjoin at an edge;
the edges are substantially parallel to the cavity bottom;
the edges form a polygon in the interior of the cavity; and
for the at least one depth into the cavity, the polygon is smaller than the cavity bottom.

14. The illumination system of claim 3, wherein in a cross-section that is substantially orthogonal to the cavity bottom, each cavity wall has a curved cross-section that is convex.

15. The illumination system of claim 3, further comprising a light emitting diode that is bonded to the cavity bottom.

16. An illumination system, comprising:
a lens having a first surface configured to receive light and substantially direct the light into the lens,
the lens having a second surface, opposite the first surface, configured to substantially direct the light out of the lens,
the first surface shaped to define a cavity that extends into the lens from a cavity opening to a cavity bottom,
the cavity opening extending in a first plane and having a first cross-sectional area in the first plane,
the cavity bottom extending in a second plane and having a second cross-sectional area in the second plane, the second cross-sectional area being less than the first cross-sectional area,
the cavity having an interior bounded by a plurality of cavity walls that are each tapered inward and extend between the cavity opening and the cavity bottom,
each cavity wall including a first portion that adjoins the cavity opening, the first portion being angled with respect to a surface normal of the cavity bottom,
each cavity wall including a second portion between the first portion and the cavity bottom, the second portion being substantially orthogonal to the cavity bottom,
the plurality of cavity walls including at least one venting channel that is configured to allow displacement of material in the cavity.

17. The illumination system of claim 16, wherein the at least one venting channel includes a plurality of venting channels that are formed as cylindrical borings.

18. The illumination system of claim 16, wherein the second plane is substantially parallel to the first plane.

19. The illumination system of claim 16, wherein each venting channel is positioned along a respective edge between adjacent cavity walls of the plurality of cavity walls.

20. An illumination system, comprising:
a lens having a first surface configured to receive light and substantially direct the light into the lens,
the lens having a second surface, opposite the first surface, configured to substantially direct the light out of the lens,
the first surface shaped to define a cavity that extends into the lens from a cavity opening to a cavity bottom,
the cavity opening extending in a first plane and having a first cross-sectional area in the first plane,
the cavity bottom extending in a second plane that is substantially parallel to the first plane and having a second cross-sectional area in the second plane, the second cross-sectional area being less than the first cross-sectional area,
the cavity having an interior bounded by a plurality of cavity walls that are each tapered inward and extend between the cavity opening and the cavity bottom,
each cavity wall including a first portion that adjoins the cavity opening, the first portion being angled with respect to a surface normal of the cavity bottom,
each cavity wall including a second portion between the first portion and the cavity bottom, the second portion being substantially orthogonal to the cavity bottom,
the plurality of cavity walls including a plurality of venting channels that are positioned along respective edges between adjacent cavity walls of the plurality of cavity walls, the plurality of venting channels being configured to allow displacement of material in the cavity.

* * * * *